US011616123B2

(12) United States Patent
Salemi et al.

(10) Patent No.: US 11,616,123 B2
(45) Date of Patent: Mar. 28, 2023

(54) ENHANCEMENT ON-STATE POWER SEMICONDUCTOR DEVICE CHARACTERISTICS UTILIZING NEW CELL GEOMETRIES

(71) Applicant: Alph and Omega Semiconductor International LP, Toronto (CA)

(72) Inventors: Arash Salemi, Cary, NC (US); David Sheridan, Greensboro, NC (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 0 days.

(21) Appl. No.: 17/175,256

(22) Filed: Feb. 12, 2021

(65) Prior Publication Data

US 2022/0262902 A1   Aug. 18, 2022

(51) Int. Cl.
   *H01L 29/06*    (2006.01)
   *H01L 29/66*    (2006.01)
   *H01L 29/78*    (2006.01)

(52) U.S. Cl.
   CPC ...... *H01L 29/0696* (2013.01); *H01L 29/0607* (2013.01); *H01L 29/66712* (2013.01); *H01L 29/7802* (2013.01)

(58) Field of Classification Search
   CPC ........... H01L 29/0696; H01L 29/66712; H01L 29/7802; H01L 29/0607
   See application file for complete search history.

(56) References Cited

U.S. PATENT DOCUMENTS

| 4,642,674 A * | 2/1987 | Schoofs | H01L 29/0696 |
| | | | 257/341 |
| 6,346,727 B1 * | 2/2002 | Ohtomo | H01L 29/0696 |
| | | | 257/E27.06 |
| 7,372,100 B2 * | 5/2008 | Saito | H01L 29/7811 |
| | | | 257/E29.066 |

(Continued)

OTHER PUBLICATIONS

D. Xing, et al. "Design Strategies for Rugged SiC Power Devices", 2019 IEEE International Reliability Physics Symposium (IRPS), Monterey, CA, USA, 2019, pp. 1-5, doi: 10.1109/IRPS.2019.8720557.

*Primary Examiner* — Bilkis Jahan
*Assistant Examiner* — Victor V Barzykin
(74) *Attorney, Agent, or Firm* — JDI Patent; Joshua D. Isenberg; Robert Pullman

(57) ABSTRACT

A semiconductor device and a method of making thereof are disclosed. The device includes a substrate heavily doped with a first conductivity type and an epitaxial layer lightly doped with the first conductivity type formed on the substrate. A buffer layer between the substrate and the epitaxial layer is doped with the first conductivity type at a doping level between that of the substrate and that of the epitaxial layer. A cell includes a body region doped with the second conductivity formed in the epitaxial layer. The second conductivity type is opposite the first conductivity type. The cell includes a source region doped with the first conductivity type and formed in at least the body region. The device further includes a short region doped with the second conductivity type formed in the epitaxial layer separated from source region of the cell by the body region of the cell wherein the short region is conductively coupled with the source region.

22 Claims, 21 Drawing Sheets

(56) References Cited

U.S. PATENT DOCUMENTS

| | | | | |
|---|---|---|---|---|
| 8,058,686 B2* | 11/2011 | Yamanobe | H01L 29/7802 | 438/587 |
| 10,192,960 B2* | 1/2019 | Wada | H01L 29/7811 | |
| 10,263,105 B2* | 4/2019 | Iwamuro | H01L 29/1095 | |
| 10,600,871 B2* | 3/2020 | Bolotnikov | H01L 29/7816 | |
| 2004/0031989 A1* | 2/2004 | Blanchard | H01L 29/42324 | 257/E29.129 |
| 2009/0096020 A1* | 4/2009 | Yamanobe | H01L 29/66068 | 257/337 |
| 2010/0219462 A1* | 9/2010 | Darwish | H01L 29/1095 | 257/329 |
| 2014/0367771 A1* | 12/2014 | Chatty | H01L 29/66719 | 257/329 |
| 2015/0053999 A1* | 2/2015 | Kumagai | H01L 29/7397 | 257/77 |
| 2015/0372088 A1* | 12/2015 | Bolotnikov | H01L 29/1608 | 438/510 |
| 2016/0155836 A1* | 6/2016 | Iwamuro | H01L 29/12 | 257/77 |
| 2016/0181372 A1* | 6/2016 | Wada | H01L 29/1095 | 257/77 |
| 2017/0338300 A1* | 11/2017 | Bolotnikov | H01L 29/66068 | |
| 2017/0338313 A1* | 11/2017 | Bolotnikov | H01L 29/0623 | |
| 2017/0338314 A1* | 11/2017 | Bolotnikov | H01L 29/0623 | |
| 2018/0019309 A1* | 1/2018 | Radhakrishnan | H01L 29/66068 | |
| 2018/0047844 A1* | 2/2018 | Banerjee | H01L 29/66712 | |
| 2019/0019887 A1* | 1/2019 | Willmeroth | H01H 9/54 | |
| 2019/0245052 A1* | 8/2019 | Ohoka | H01L 29/417 | |
| 2019/0348524 A1* | 11/2019 | Ebiike | H01L 21/2652 | |
| 2020/0020793 A1* | 1/2020 | Ryu | H01L 29/0607 | |
| 2020/0083372 A1* | 3/2020 | Kikuchi | H01L 29/66666 | |
| 2020/0258985 A1* | 8/2020 | Bolotnikov | H01L 29/7455 | |
| 2020/0312955 A1* | 10/2020 | Kubo | H01L 29/7802 | |
| 2020/0365721 A1* | 11/2020 | Lichtenwalner | H01L 29/66068 | |

* cited by examiner

ENHANCEMENT ON-STATE POWER SEMICONDUCTOR DEVICE CHARACTERISTICS UTILIZING NEW CELL GEOMETRIES

FIELD OF THE DISCLOSURE

This disclosure generally relates to metal-oxide-semiconductor field-effect transistors (MOSFETs), and more specifically MOSFET cell geometry.

BACKGROUND OF INVENTION

In prior art MOSFET devices, the layout of each cell includes a source contact and a short from the source contact to the body region next to the source region. The short from source to the body region prevents the activation of the parasitic Bipolar Junction Transistor (BJT) allowing reverse current flow between the drain and the source and degrading the blocking voltage of MOSFET from Open Emitter Breakdown Voltage ($BV_{CBO}$) to Open Base Breakdown Voltage ($BV_{CEO}$). The prior art MOSFET devices thus had relatively large cells because a region directly next to the source region was taken up by a short region that included a short contact conductively coupled to the source. The short region facilitates contact between the source and body regions. The short region takes up space and the body regions must be larger to account for the contact. As such, the pitch reduction of the prior art cells was limited.

FIG. 9 illustrates the nature of the pitch limitation due to the short region. As shown in FIG. 9 the prior art cell geometries had body regions 901 that included both source regions 904 and a P+ doped short region 902 within the source region 904. This increases the size of both the source region 904 and body region 901 as the source region 904 must be large enough to encompass the short region 902 and the body region 901 must be large enough to encompass the enlarged source region 904. A large body region 901 size means that the cell pitch 905 pitch is large because each cell takes up more room on the surface of the device. A channel area is formed at the contact boundary between then the body region 901 and an epitaxial layer Junction Field Effect Transistor (JFET) region 903 in this channel region charge and carrier combine to allow current to flow through the device. Increased channel area means a decrease in device 'on' resistance. A reduced cell pitch along with a higher channel and JFET density results in a lower on-resistance. Prior to the present disclosure reducing cell pitch 905 has a limitation as the prior layouts placed the short region 902 next to the source region 904.

Additionally, many prior art cells utilized a shared contact metal for both the source contact and the short contact. However, the source region and body region are of opposite conductivity types. For example, in an N-type device, the source region is N-doped and the body region is P-doped. The optimal contact metal of P-doped silicon carbide (SiC) differs from the optimal contact metal of N-type doped SiC. This meant that either the short contact or the source contact used a suboptimal contact metal.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1:
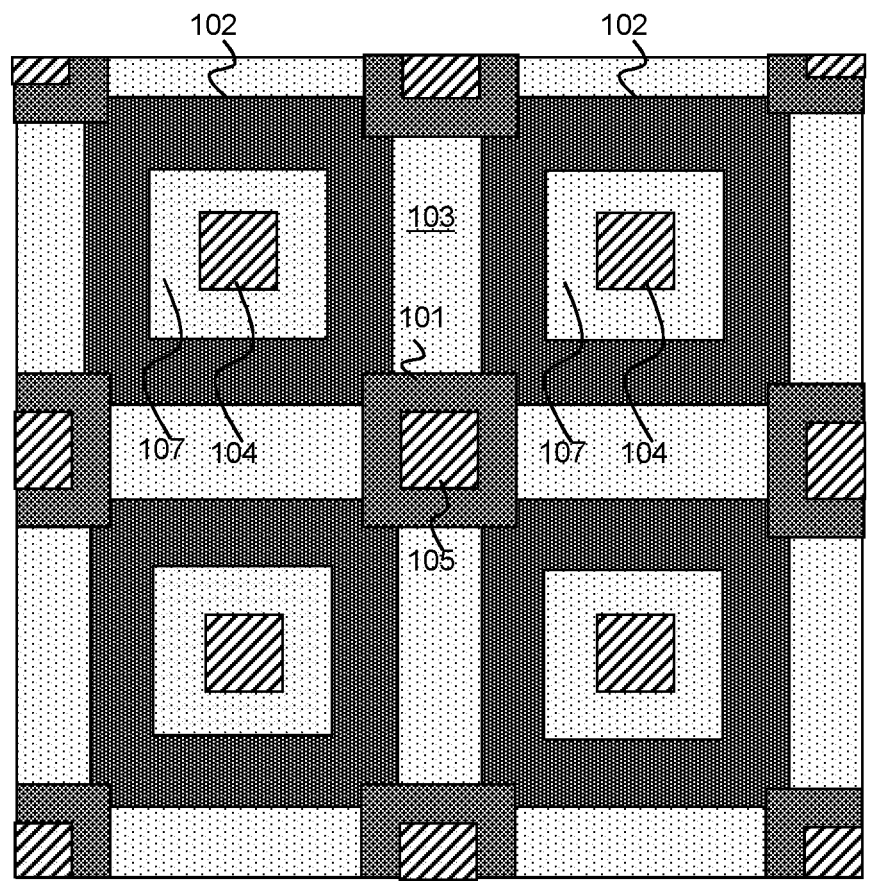
FIG. 1 depicts a top-down view of the epitaxial layer of an improved semiconductor device cell geometry having square body regions and shared short regions according to aspects of the present disclosure.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (P or N) refers generally to a relative degree of concentration of designated type of net impurity carriers within a semiconductor material. In general terms, an N+ material has a higher N type net dopant (or charge carrier, e.g., electron) concentration than an n material, and an N material has a higher carrier concentration than an N− material. Similarly, a P+ material has a higher P type net dopant (or charge carrier, e.g., hole) concentration than a P material, and a p material has a higher concentration than a p− material. It is noted that what is relevant is the net concentration of the charge carriers, not necessarily the dopants. For example, a material may be heavily doped with N-type dopants but still have a relatively low net carrier concentration if the material is also sufficiently counter-doped with P-type dopants. As used herein, a concentration of dopants less than about $10^{16}$ cm$^{-3}$ may be regarded as "lightly doped" and a concentration of dopants greater than about $10^{18}$ cm$^{-3}$ may be regarded as "heavily doped".

The semiconductor device having an improved cell geometry may comprise a substrate heavily doped with a first conductivity type and an epitaxial layer lightly doped with the first conductivity type formed on the substrate. In some implementations a Buffer layer with a higher doping concentration than the epitaxial layer could be utilized between the substrate and epitaxial layer. Areas of the epitaxial layer are divided into at least one cell. The cell includes a body region doped with the second conductivity type formed in the epitaxial layer and a source region doped with the first conductivity type formed in at least the body region. The second conductivity type is opposite the first conductivity type. Additional operational regions of the device further include a short region doped with the second conductivity type formed in the epitaxial layer separated from source region of the cell by the body region of the cell wherein the short region is conductively coupled to the source region.

The improved semiconductor device may include a body region of the cell that is in ohmic contact with the short region. A junction field effect transistor (JFET) region of the epitaxial layer may separate a portion of the short region from the body region of the cell and a strip of the short region may interrupt the JFET region. In such implementations, the strip of the short region makes ohmic contact with the body region of the cell. The improved semiconductor device may comprise more than one cell wherein the short region is shared between two or more cells. A strip of the short region may be a width sufficient for current to travel to the body region from the short region.

The improved semiconductor device may also include more than one cell wherein the short region is shared between two or more cells. Each cell of the more than one cells may be separated by a JFET region and the width of the JFET region may be chosen such that the device will have a sufficient low on-resistance and reduced electric field across the gate oxide.

The improved semiconductor device may include a gate formed over the epitaxial layer and a portion of the body region. The gate may include an insulating layer formed on top of the epitaxial layer and a conductive layer formed on top of the insulating layer.

The improved semiconductor device may further include a source contact coupled to the source region and a short contact coupled to the short region wherein a material of the source contact is different than a material of the short contact. The material of the source contact may be a metal and the material of the short contact may be a metal that is different than the metal of the source contact FIG. 1 depicts a top-down view of the epitaxial layer of an embodiment of improved semiconductor device cell geometry having square body regions and shared source regions according to aspects of the present disclosure. In the illustrated implementation, the body regions 102 have a square or rectangular shape. JFET regions 103 are formed in the epitaxial layer of the semiconductor device between the body regions 102. A source contact 104 is formed over the source region 107 within the body region 102. The source contact 104 as shown is square and located in the center of the source region 107 within the body region 102. The source region 107 and source contact 104 may be of any shape and may be located anywhere within the body region 102 so long as portion of the body region 102 separates the source region 107 from the short region 101 or the short region contact 105. The short region 101 is separated from the body region 102 and allows for a reduction in the size of the body region 102 and also a reduction in the pitch of body regions 102. A short region 101 is located between body regions 102.

The short region 101 may be in ohmic contact with at least one body region and may in some embodiments be in contact with up to two, three, four, five, six or more than six body regions. As shown, the short region 101 is shared between four body regions 102 and each body region 102 is in contact with multiple short regions 101. The short regions 101 ensure that the body regions 102 are at the source voltage thus preventing a reverse flow of current through the parasitic BJT. The width of the JFET region 103 between body regions is chosen to have sufficient low on-resistance and reduced electric field across the gate oxide. In the implementation depicted in FIG. 1, the short region 101 is disposed at the intersection between four body regions.

The JFET regions 103 and epitaxial layer may be of a first conductivity type where the first conductivity type is opposite a second conductivity type. The body regions 102 and the short regions 101 may be formed in selected portions of the epitaxial layer by doping with suitable second conductivity type dopants. Source regions 107 may be formed in selected portions of the body regions 102 by doping with suitable first conductivity type dopants. For example, the epitaxial layer, source region 107 and JFET regions 103 may be doped with N-type dopants, e.g., by ion implantation, and the short region 101 and body region 102 may be similarly doped with P-type dopants. Examples of N-type dopants include, but are not limited to, Phosphorus, Nitrogen, Arsenic, Antimony, Bismuth, Lithium, or any other material that provides free negative charge carriers (e.g., electrons) when incorporated into a semiconductor material, such as silicon. Examples of P-type dopants include, but are not limited to, Boron, Aluminum, Gallium, Indium or any other material that provides positive charge carriers (e.g., holes) when incorporated into a semiconductor material, such as silicon.

Figure 2:
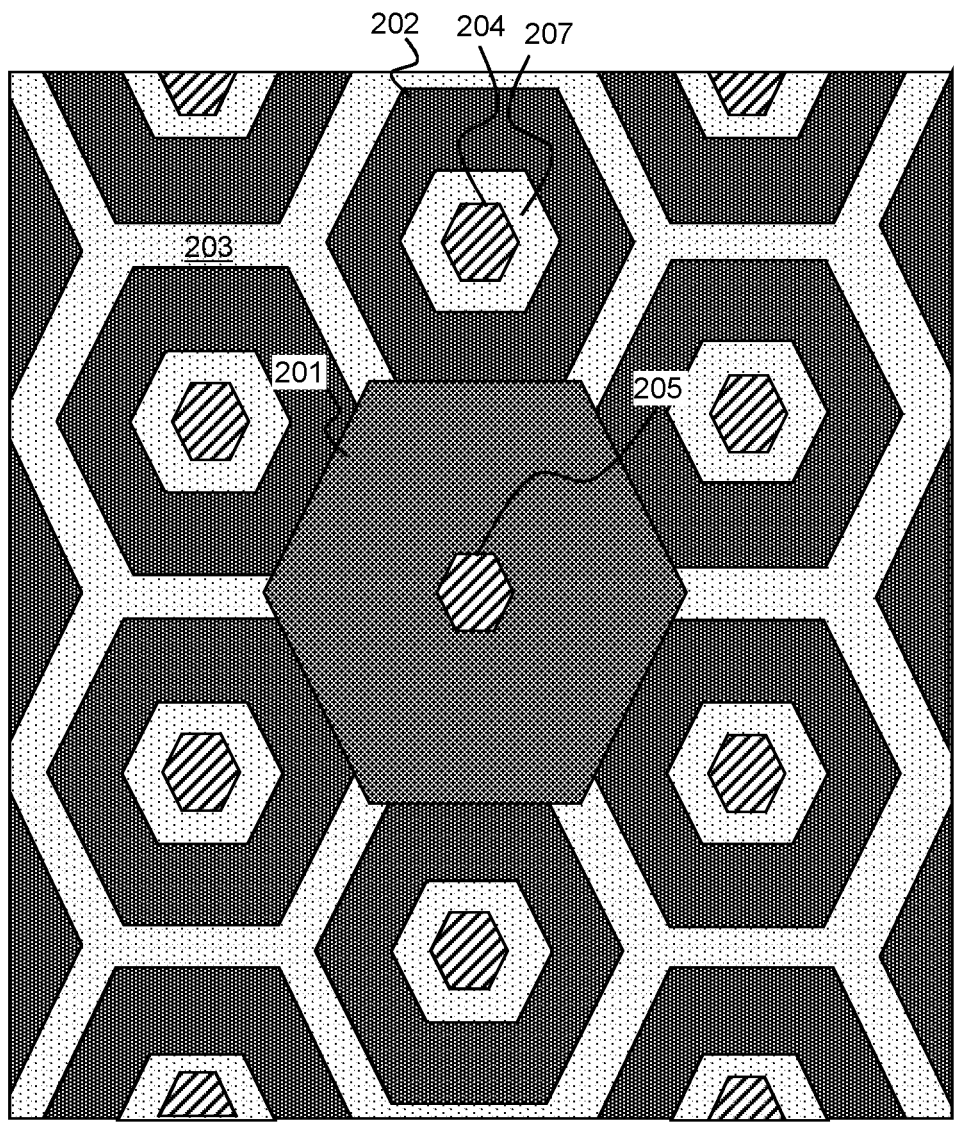
FIG. 2 shows a top-down view of the epitaxial layer of an alternative improved semiconductor device cell geometry having body regions and short regions that are hexagonal according to aspects of the present disclosure.

FIG. 2 shows a top-down view of the epitaxial layer of an alternative implementation of an improved semiconductor device cell geometry having the body regions 202 and short regions 201 that are hexagonal according to aspects of the present disclosure. The body regions 202 share a side with the short region 201. A small, short contact 205 is located in the middle of the short region 201. A short contact 204 is located inside the Source region 207. Source regions 207 are located inside the body regions 202 and the body region 202 separates the short region 201 from the source region 207. Here, the body regions 202 are disposed about the long edges of the short region 201. Wide JFET regions 203 at body region corners are largely avoided by the hexagonal shaped regions which insure shorter intersection geometries. The hexagonal body regions 202 are designed such a way to have the same JFET gap value anywhere including the corners thus having a stable breakdown voltage. However, due to higher electric crowding at the corners, the BV of hexagon, and square cell geometries might be lower than the linear and octagon cells.

Figure 3:
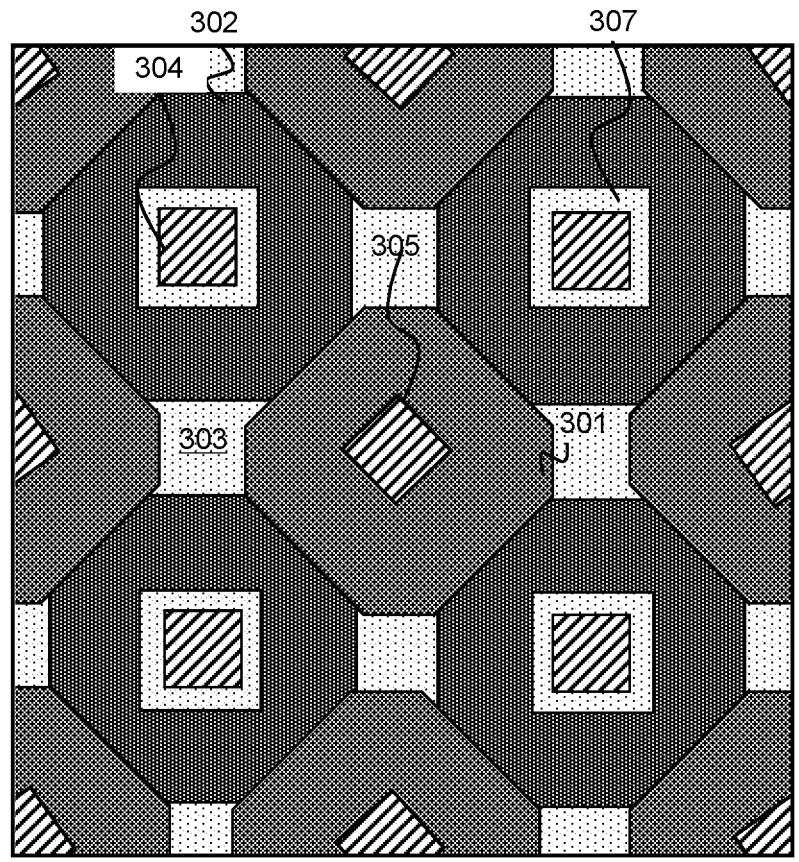
FIG. 3 depicts a top-down view of the epitaxial layer of another alternative improved semiconductor device cell geometry having octagonal body regions and diamond shaped short regions according to aspects of the present disclosure.

FIG. 3 depicts a top-down view of the epitaxial layer of another alternative implementation of an improved semiconductor device cell geometry having octagonal body regions 302 and diamond or octagonal shaped short regions 301 according to aspects of the present disclosure. The sides of the diamond or octagonal body regions 302 are in ohmic contact with the sides of the short region 301. The short contact 305 is conductively coupled to the source and the consequently coupled to the source contact 304 and source region 307. In the shown in embodiment the short region is disposed at the intersection between four body regions.

Figure 4:
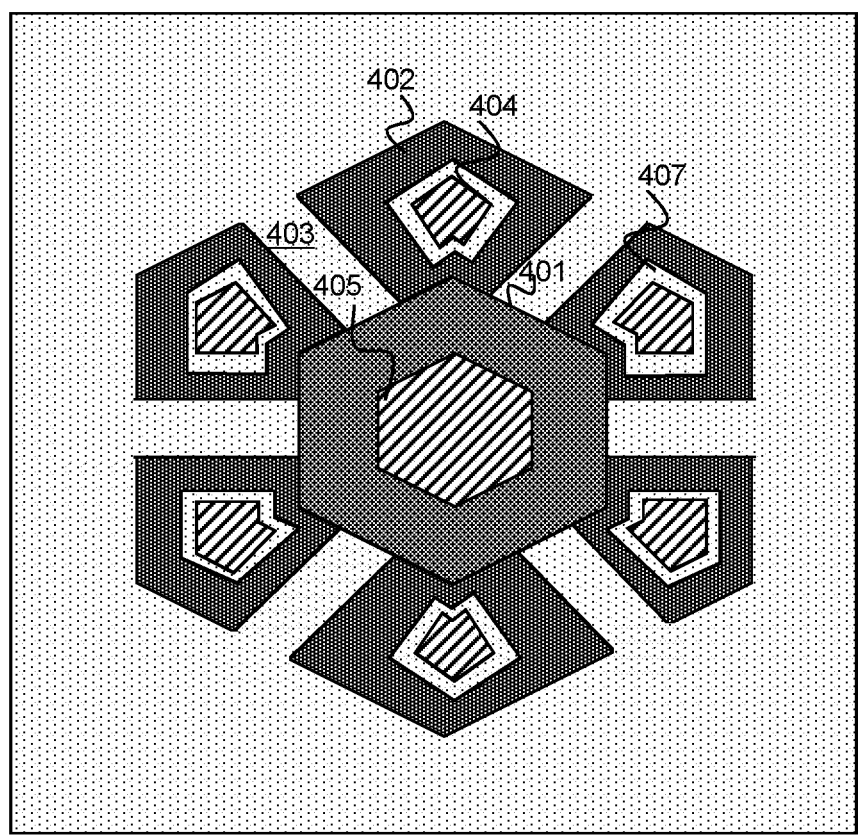
FIG. 4 shows a top-down view of the epitaxial layer of another embodiment of another alternative improved semiconductor device cell geometry having body regions located at the corners of the hexagonal short region according to aspects of the present disclosure.

FIG. 4 shows a top-down view of the epitaxial layer of another implementation of an improved semiconductor device cell geometry having body regions 402 located at the corners of the hexagonal short region 401 according to aspects of the present disclosure. In the example shown in FIG. 4, the body regions 402 are shaped to create an overall hexagonal shape for the collection of body regions 402 and short region 401. For the sake of simplicity, a single functional unit having six body regions 402 in ohmic contact with the short region 401 is depicted in FIG. 1. However, the semiconductor device may have multiple functional units of the type shown in FIG. 4 arranged next to each other. As shown, source contact 404 is located in each of the source regions 407 and the source regions 407 and source contacts 404 are shaped as irregular hexagons to accommodate the shape of the body region 402 and the corners of the short region 401. The short region 401 has a hexagonal short contact 405.

Figure 5:
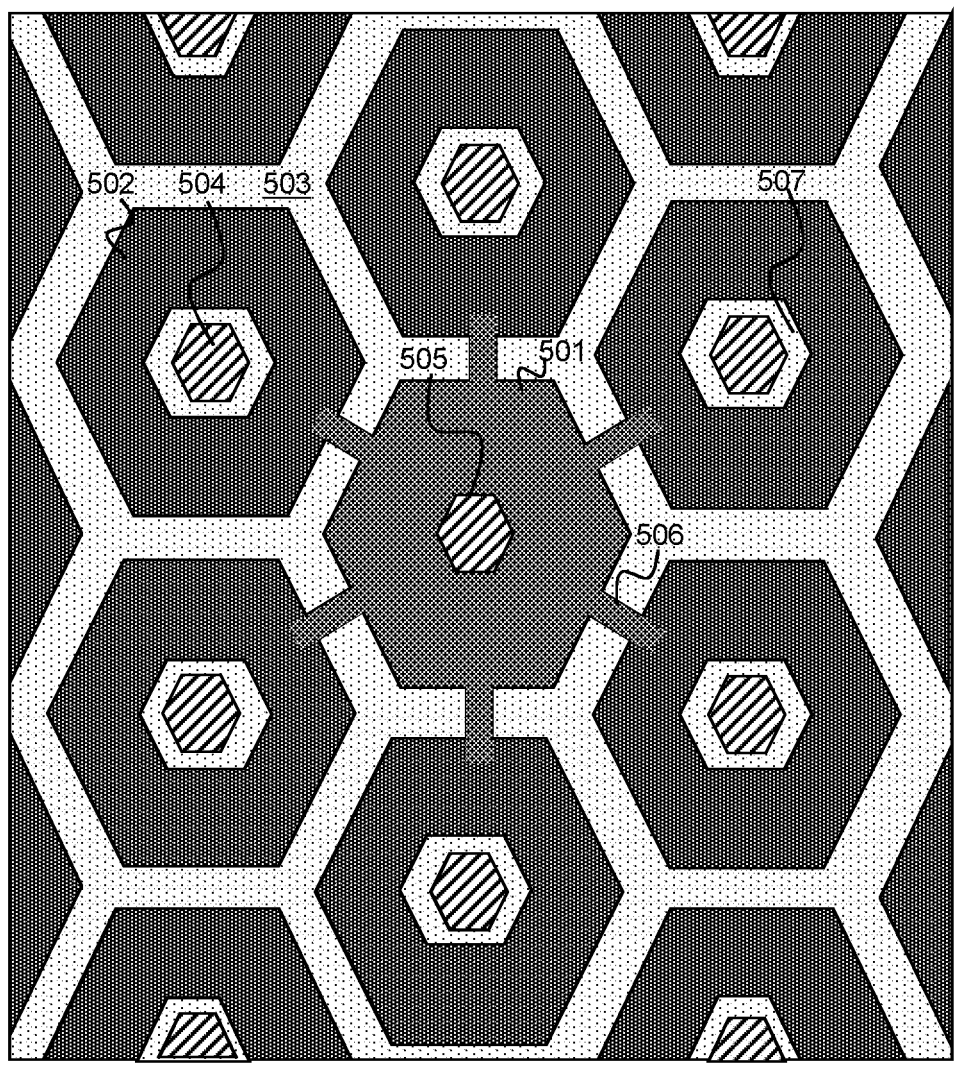
FIG. 5 depicts a top-down view of the epitaxial layer of another alternative improved semiconductor device cell geometry having hexagonal body regions and a hexagonal short region with strips that interrupt a JFET region according to aspects of the present disclosure.
Figure 6:
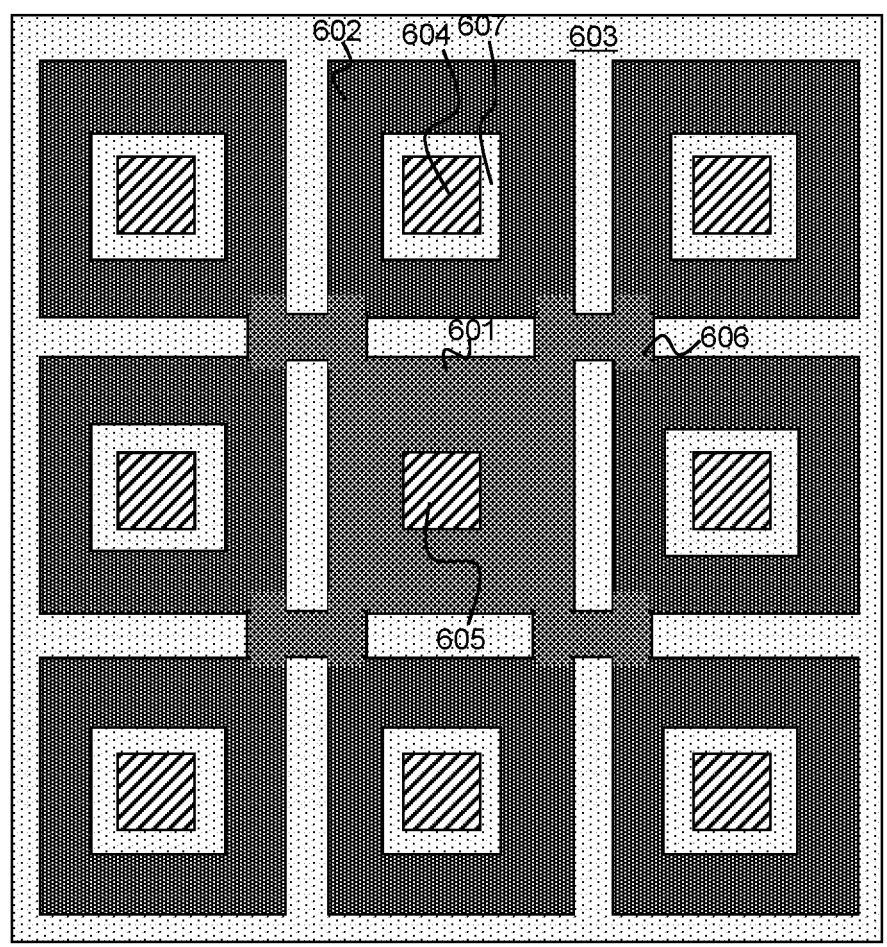
FIG. 6 shows a top-down view of the epitaxial layer of another alternative improved semiconductor device cell geometry having square body regions and a square short region in ohmic contact with the body regions through strips of the short region that interrupt a JFET region according to aspects of the present disclosure.
Figure 7:
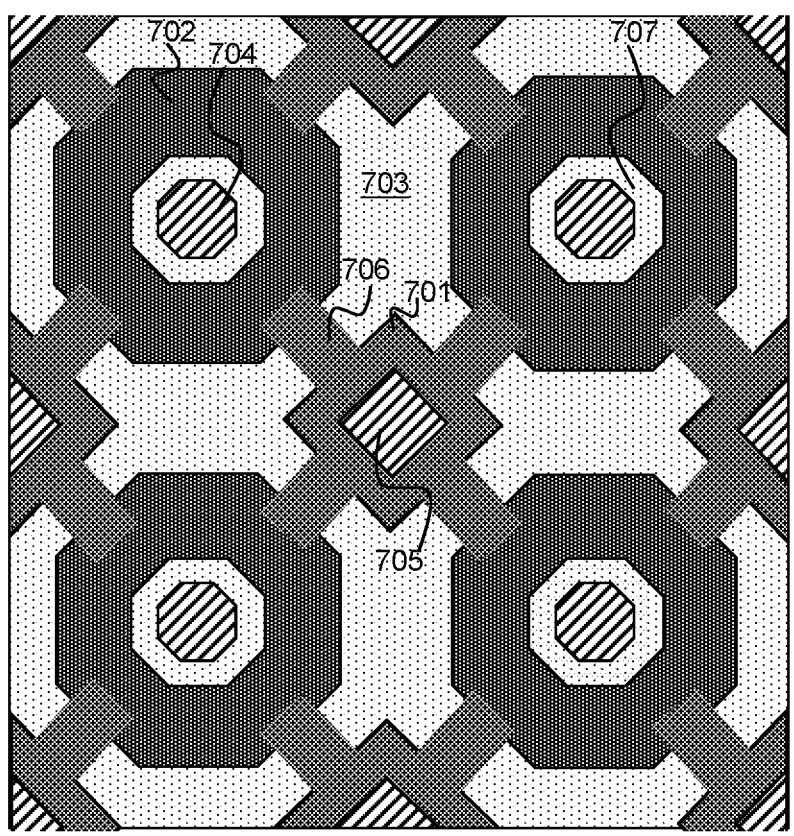
FIG. 7 depicts a top-down view of the epitaxial layer of another embodiment of the improved semiconductor device cell geometry having octagonal body region and a square or diamond short region in ohmic contact with the body through strips of the short region that interrupt a JFET region according to aspects of the present disclosure.

FIGS. 1-4 depict implementations wherein the short regions are in direct ohmic contact with the body regions. This allows the reduction in cell pitch by overcoming the cell size reduction limit due to the geometry of the short contact next to the source contact. FIGS. 5-7 show other implementations where strips of the short region that interrupt the JFET region and make ohmic contact between the short region and the body regions. Additionally, the short region in contact with the body region through strips of the short region allows for greater JFET region and channel density as less space is required for the short region. This allows for better channel density and reduced 'on' resistance.

FIG. 5 depicts a top-down view of the epitaxial layer of another embodiment of the improved semiconductor device cell geometry having hexagonal body regions 502 and a hexagonal short region 501 with strips 506 of the short region that interrupt the JFET region 503 according to aspects of the present disclosure. The short region 501 makes ohmic contact with the body region 502 through the strips 506. The source region 507 is conductively coupled to the short region 501 through a short contact 505 and the source contact 504. The ohmic contact between the body regions 502 and the source region 507 short region 501 keeps the body regions at source voltage during operation to ensure that the parasitic BJT is inactive.

FIG. 6 shows a top-down view of the epitaxial layer of another implementation of an improved semiconductor device cell geometry according to aspects of the present disclosure. In this implementation, the cell geometry is characterized by square body regions 602 and a square short region 601 in ohmic contact with the body through strips of the short region 606 that interrupt the JFET region 603. The source region 607 is conductively coupled to the short region 601 through the short contact region 605 and the source contact 604, which are connected to the source and serves to keep the short contact at source voltage to prevent activation of the parasitic JFET.

FIG. 7 depicts a top-down view of the epitaxial layer of yet another implementation of an improved semiconductor device cell geometry according to aspects of the present disclosure. In this implementation, the cell geometry is characterized by an octagonal body region 702 and an octagonal or diamond short region 701 in ohmic contact with the body through strips of the short region 706 that interrupt the JFET region 703. The short region 701 is in ohmic contact with the body region 702 through strips of the short region 706 that bridge short region through the JFET Region 703 and interrupt the JFET region 703. A source region 707 is conductively coupled to the short region 701 at the short contact 705 through the source contact 704.

Similar to the examples depicted in FIGS. 1-4 the width of the JFET region between body regions in FIGS. 5-7 is chosen to have sufficient low on-resistance and reduced electric field across the gate oxide. The width and other dimensions of the strips of the short region that make ohmic contact with the body region are chosen to maximize the JFET region and not constrict ohmic contact between the short region and the body region or regions. In the implementations shown in FIGS. 1-7 the JFET region is doped with ions of the first conductivity type, the body region is doped with ions of the second conductivity type. The source region is doped with the first conductivity and the short region, including the short contact, are doped with the second conductivity. The Source region and the short regions maybe conductively coupled through the source metal.

While FIGS. 1-7 depict various shapes for the body region and short region, reducing the cell pitch other shapes for body regions and short regions, not shown, are also envisioned such as circular, ovoid, pentagonal, etc.

Method of Making

Figure 8A:
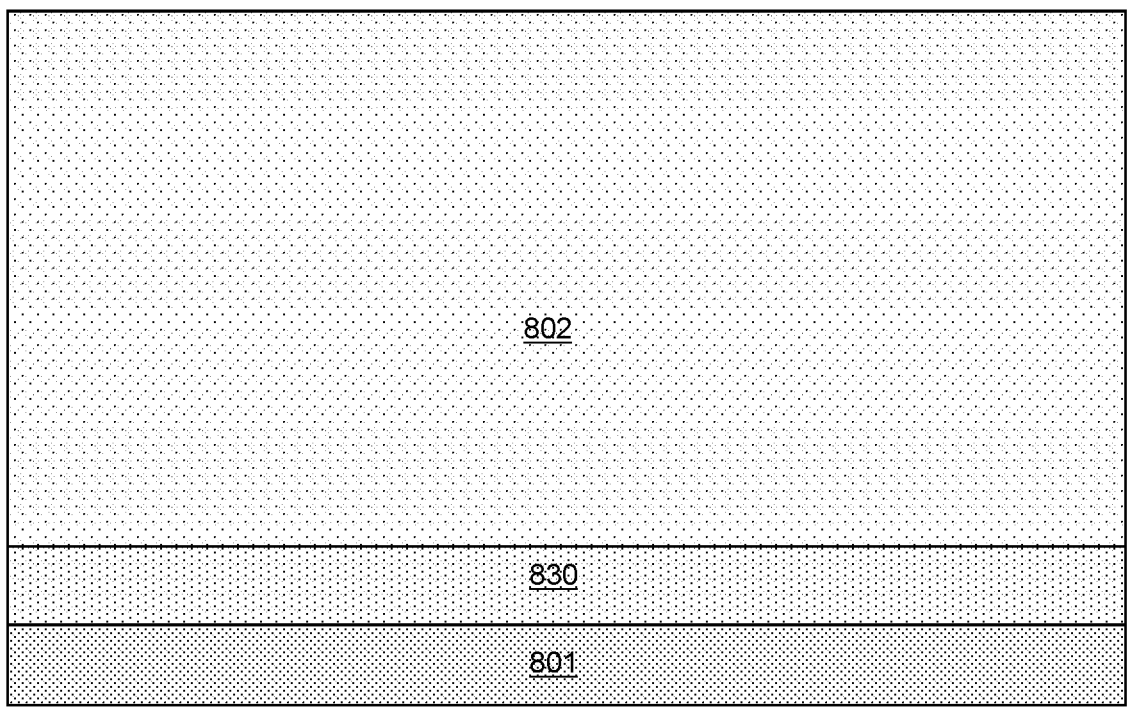
FIG. 8A shows a cross-sectional side view of a partially-formed semiconductor device having improved cell geometry with an epitaxial layer on a substrate according to aspects of the present disclosure.

FIGS. 8A-8L illustrate a method of making the semiconductor device with improved cell geometry according to aspects of the present disclosure. FIG. 8A shows a cross-sectional side view of a partially-formed semiconductor device an epitaxial layer 802 lightly doped with ions of the first conductivity type formed on a substrate 801 heavily doped with ions of the first conductivity, e.g., N− epitaxial layer and N+ substrate respectively, according to aspects of the present disclosure. A Buffer layer 830 with the first conductivity may be formed above the substrate and below the epitaxial layer. The Buffer layer may be more heavily doped than the epitaxial layer 802. The epitaxial layer 802 may be grown or deposited on a surface of the substrate 801 by any known method of epitaxy such as, vapor-phase, solid phase, liquid phase, molecular beam epitaxy, etc. In some implementations, the buffer layer 830 may be epitaxially grown on the substrate 801 before the process that forms the epitaxial layer 802 or during an initial stage of such process. The doping level of the buffer layer may be in between that of the substrate and that of the epitaxial layer.

Figure 8B:
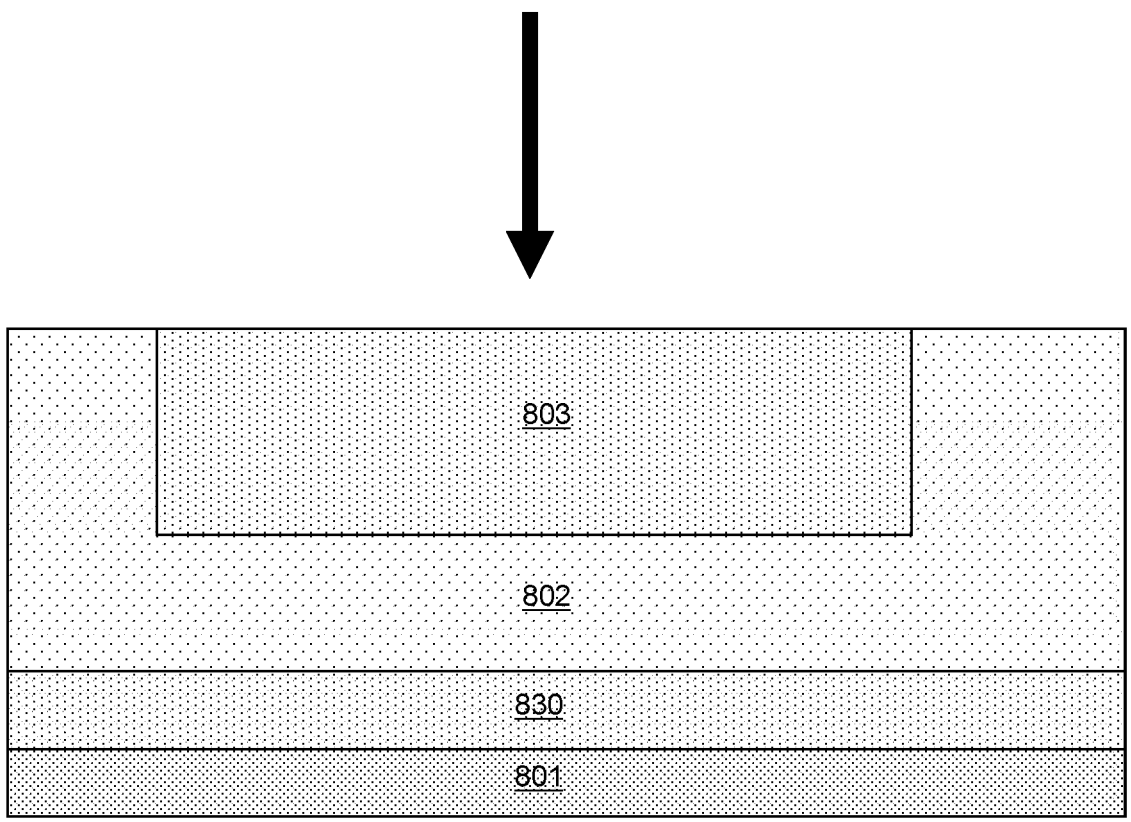
FIG. 8B depicts a cross-sectional side view of a partially-formed semiconductor device having improved cell geometry having a JFET region in the epitaxial layer lightly doped with ions of the first conductivity type and formed on a substrate heavily doped with ions of the first conductivity according to aspects of the present disclosure.

FIG. 8B depicts a cross-sectional side view of a partially-formed semiconductor device having a JFET region 803 in the epitaxial layer 802 lightly doped with ions of the first conductivity type and formed on a substrate 801 heavily doped with ions of the first conductivity according to aspects of the present disclosure. The JFET region may be doped by implanting ions of the first conductivity type at a greater concentration that the epitaxial layer 802. Alternatively, the JFET region 803 may be at the same concentration as the epitaxial layer 802. The JFET region 803 may be doped by any known method such as ion implantation, vapor phase doping etc.

Figure 8C:
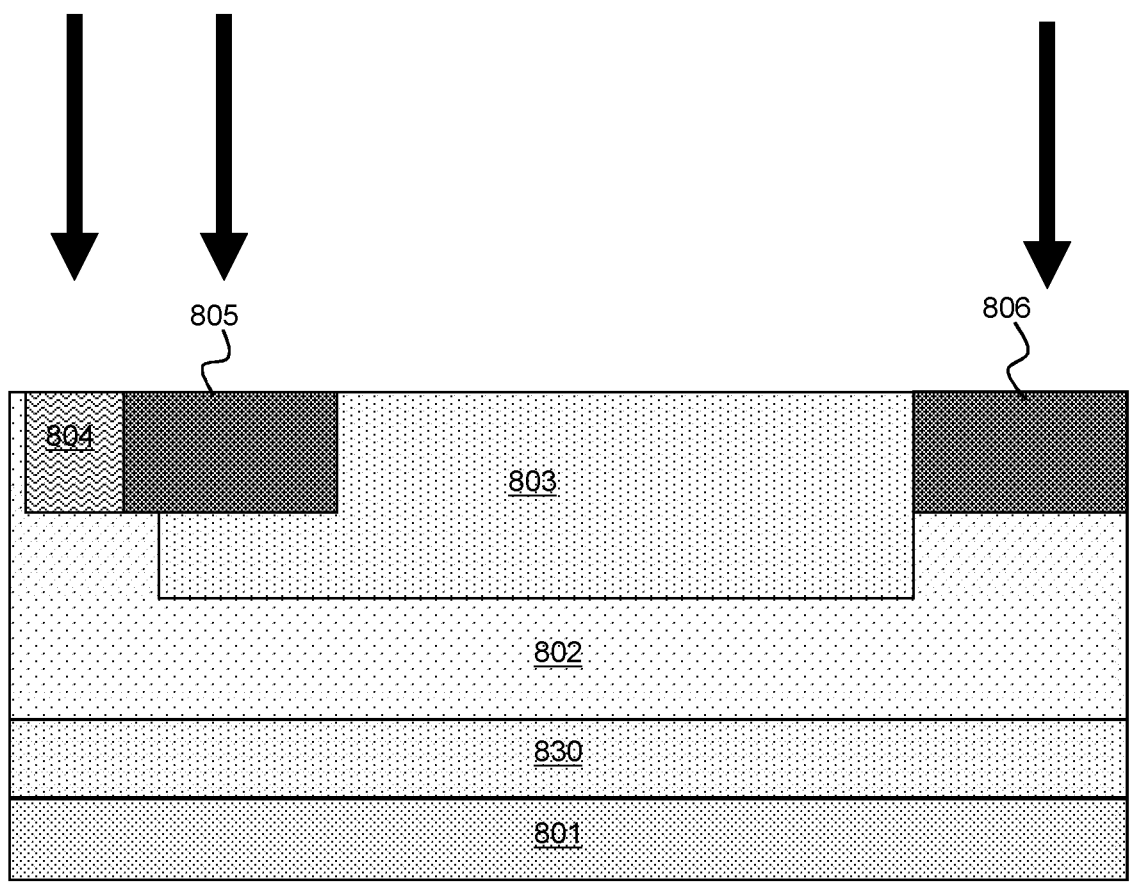
FIG. 8C shows a cross-sectional side view of a partially-formed semiconductor device having improved cell geometry with a short region, termination region and gate via region according to aspects of the present disclosure.

FIG. 8C shows a cross-sectional side view of formation of a partially-formed semiconductor device after formation of short region 805, termination region 804 and gate via region 806 according to aspects of the present disclosure. The short region 805 is formed in the JFET region 803. The gate via region 806 is formed in the epitaxial layer 802. Both the short region 805 and the gate via region 806 are heavily doped with ions of the second conductivity type e.g., p-type dopants if the epitaxial layer is N-type. The termination region 804 at a greater concentration of the second conductivity type than the epitaxial layer 802 may also be formed in the epitaxial layer 802. The length, doping concentration and depth of doping are chosen based on the desired breakdown voltage for the device. The short region 805, termination region 804 and gate via region 806 may be created via ion implantation or any other known method such as vapor phase doping etc. The short region 805 and gate via region 806 may be doped to a concentration around $10^{19}$ cm$^{-3}$.

Figure 8D:
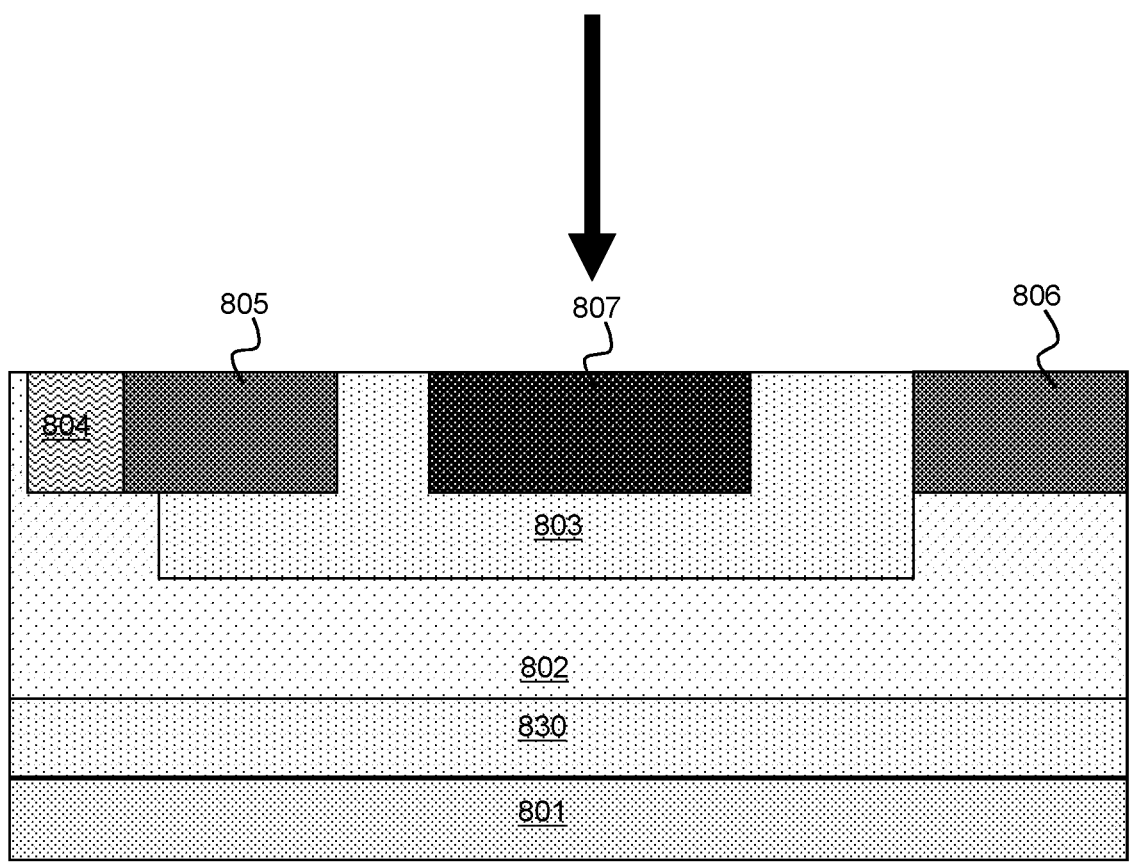
FIG. 8D depicts a cross-sectional side view of a partially-formed semiconductor device having improved cell geometry with a body region in the JFET region of the epitaxial layer after formation of short regions and gate via region according to aspects of the present disclosure.

FIG. 8D depicts a cross-sectional side view of a partially-formed semiconductor device after formation of a body region 807 in the JFET region 803 of the epitaxial layer 802 after formation of short regions 805 and gate via region 806 according to aspects of the present disclosure. The body region 807 may be doped with second conductivity type at a lesser concentration than the short region 805 or the gate via region 806. Though one body region 807 is shown, as discussed above a cell or functional unit may comprise multiple body regions in ohmic contact with at least one short region. The body region may be doped via ion implantation or any other known method such as vapor phase doping etc. The body regions 807 may be doped at a concentration of about $10^{17}$ cm$^{-3}$. Next the Shield region is created as shown in FIG. 8E.

Figure 8E:
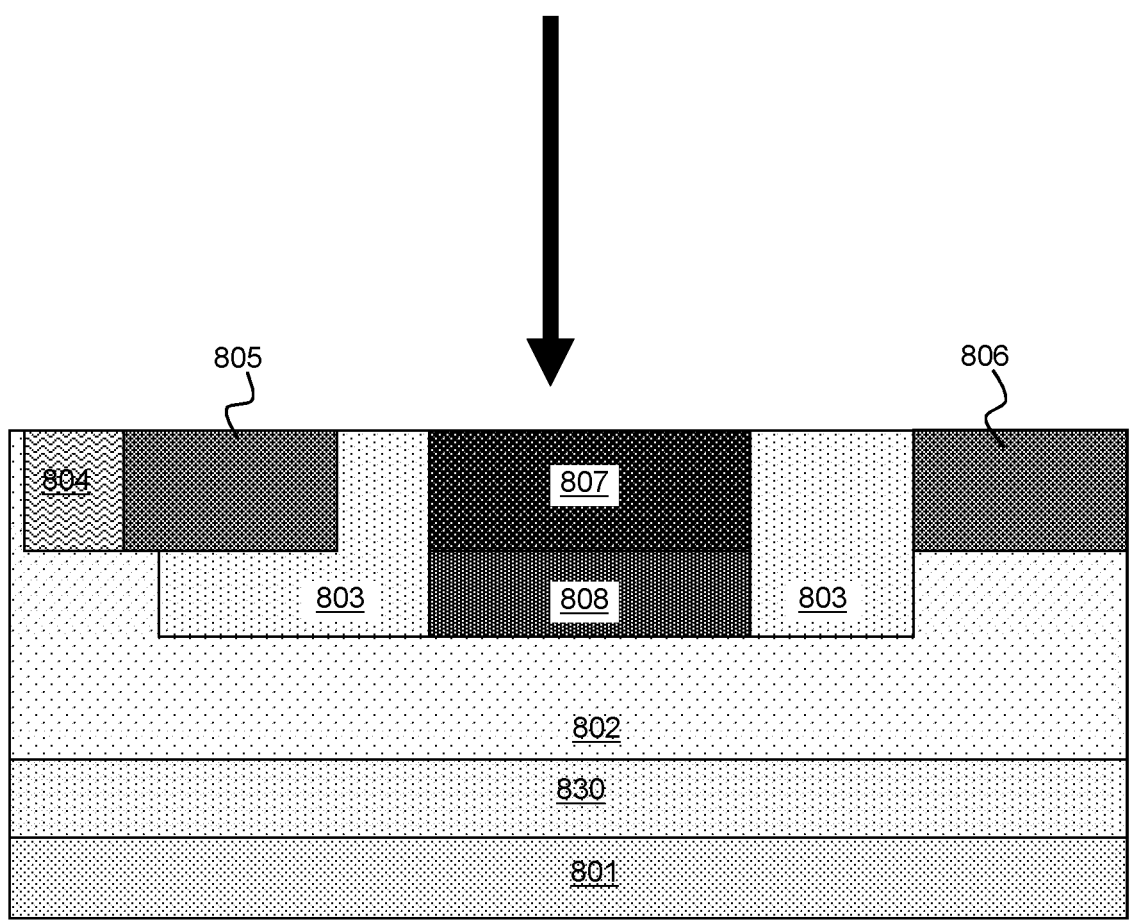
FIG. 8E shows a cross-sectional side view of a partially-formed semiconductor device having improved cell geometry with a shield region underneath the body region in the JFET region of the epitaxial layer according to aspects of the present disclosure.

FIG. 8E shows a cross-sectional side view of a partially-formed semiconductor device after formation of the shield region 808 underneath the body region 807 in the JFET region 803 of the epitaxial layer 802 according to aspects of the present disclosure. The shield region 808 may be formed via ion implantation at a greater concentration than the body region 807. The shield region 808 may be doped at a concentration of $10^{18}$ cm$^{-3}$+/−5×$10^{7}$ cm$^{-3}$ with ions of the second conductivity type.

Figure 8F:
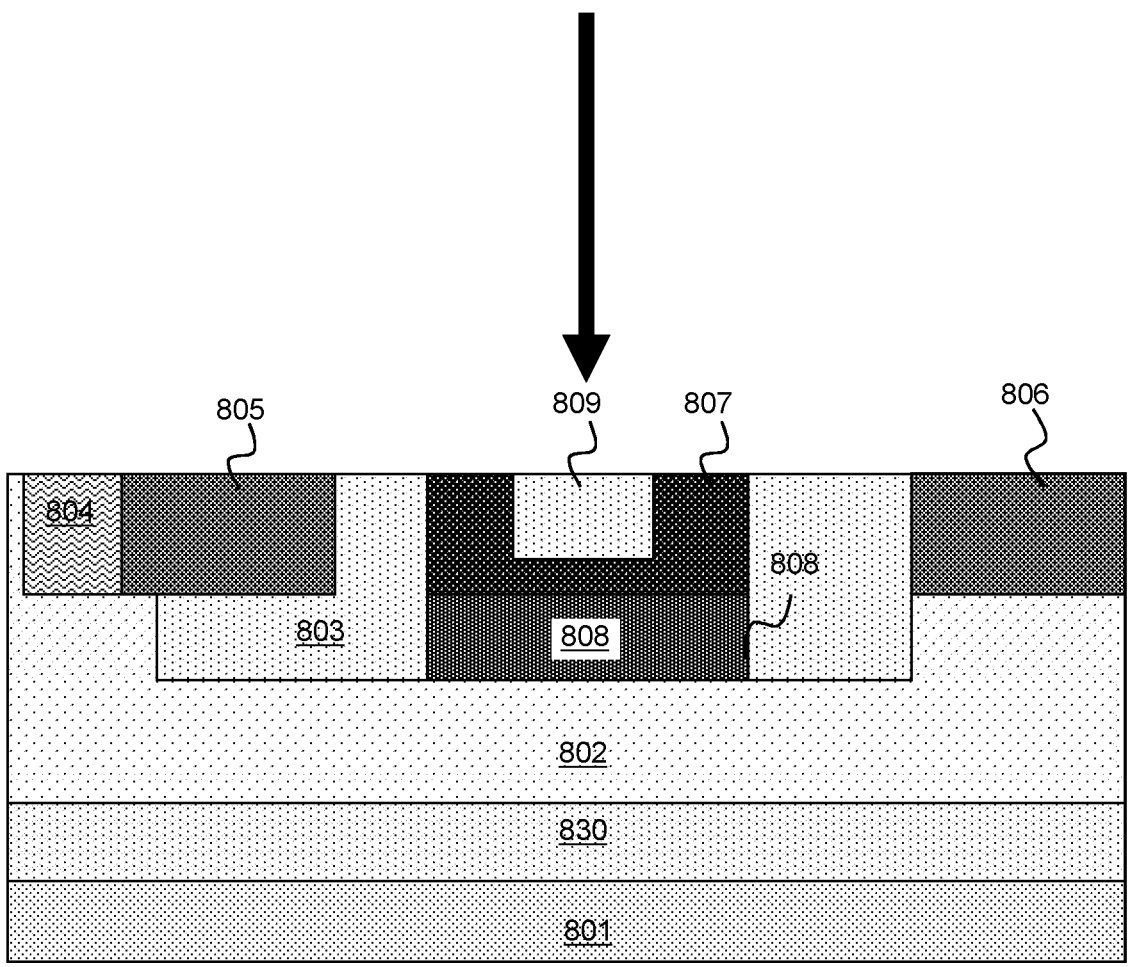
FIG. 8F depicts a cross-sectional side view of a partially-formed semiconductor device having improved cell geometry with a heavily doped source region in the body region according to aspects of the present disclosure.

FIG. 8F depicts a cross-sectional side view of a partially-formed semiconductor device after formation of a heavily doped source region 809 in the body region 807 according to aspects of the present disclosure. The source region 809 may be heavily doped with ions of the first conductivity type via ion implantation. After implantation of the source region, the semiconductor device may undergo a heat annealing step.

Figure 8G:
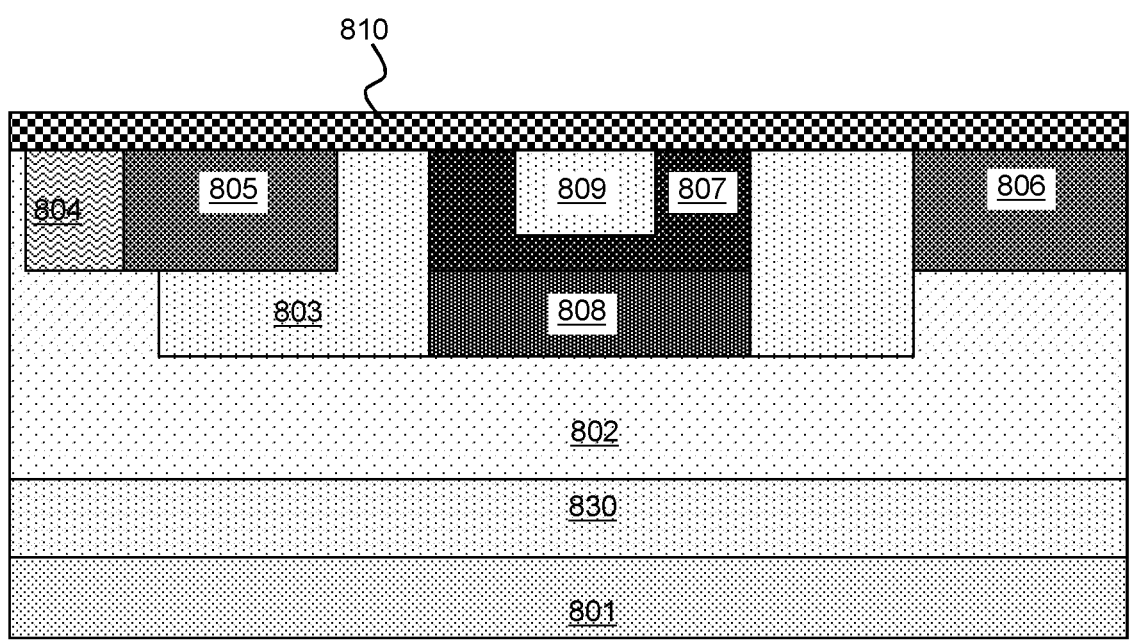
FIG. 8G depicts a cross-sectional side view of a partially-formed semiconductor device having improved cell geometry, showing capping layer application and implant annealing according to aspects of the present disclosure.

FIG. 8G depicts a cross-sectional side view of a partially-formed semiconductor device after formation of a capping layer 810 and an implant annealing according to aspects of the present disclosure. The capping layer 809 prevents the migration of surface atoms, Si desorption and dopant out-diffusion of the semiconductor such as SiC. The Capping layer may be grown on the surface of the semiconductor device may be comprised of for example and without limitation Silicon Dioxide (SiO$_2$), Silicon Nitride (Si$_3$N$_4$), Aluminum Nitride (AlN) or graphite [carbon (C)]. The capping layer may be formed by for example coating the wafer or sample with the capping material after application of suitable photoresist and baking at a temperature and time optimized for the chosen photoresist. After forming the Capping layer 810, the partially-formed semiconductor device may be heated in an oven to a temperature sufficient to anneal the implanted ions. Activation annealing temperatures vary depending upon the semiconductor type. For example, a post-high-temperature activation annealing (>1600° C. for SiC) is necessary in order to activate the dopants (>95%) even if the implantation has been done at elevated temperature.

After the annealing step, the capping layer 810 is removed.

After activation annealing a sacrificial oxidation process may be done.

A smooth surface roughness might improve the device performance, e.g., ohmic contact. Therefore, a sacrificial oxidation process after ion implantation and dry etching might be done before the insulating layer formation. Sacrificial oxidation could be done by thermal (wet or dry) oxidation. Then this oxide layer is removed by wet-etching. Sacrificial oxidation and removal may be done one or more than one times to ensure a low surface roughness.

Figure 8H:
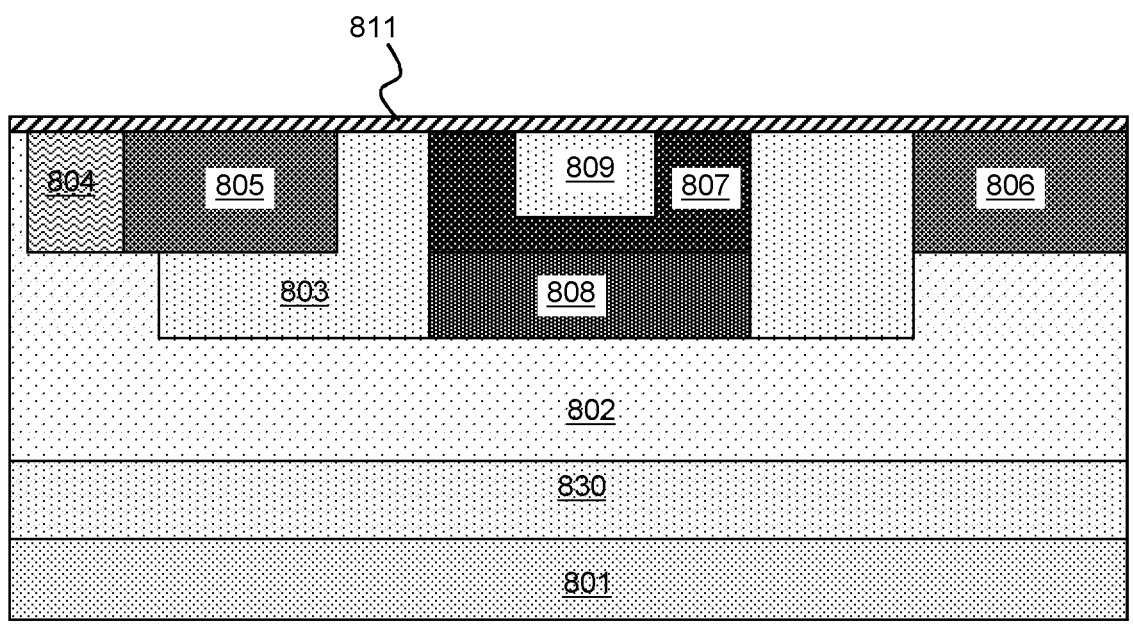
FIG. 8H shows a cross-sectional side view of a partially-formed semiconductor device having improved cell geometry, insulation layer on the surface of the semiconductor device over top the termination region, short region, JFET region, Body region, source region, and gate via region according to aspects of the present disclosure.
Figure 8I:
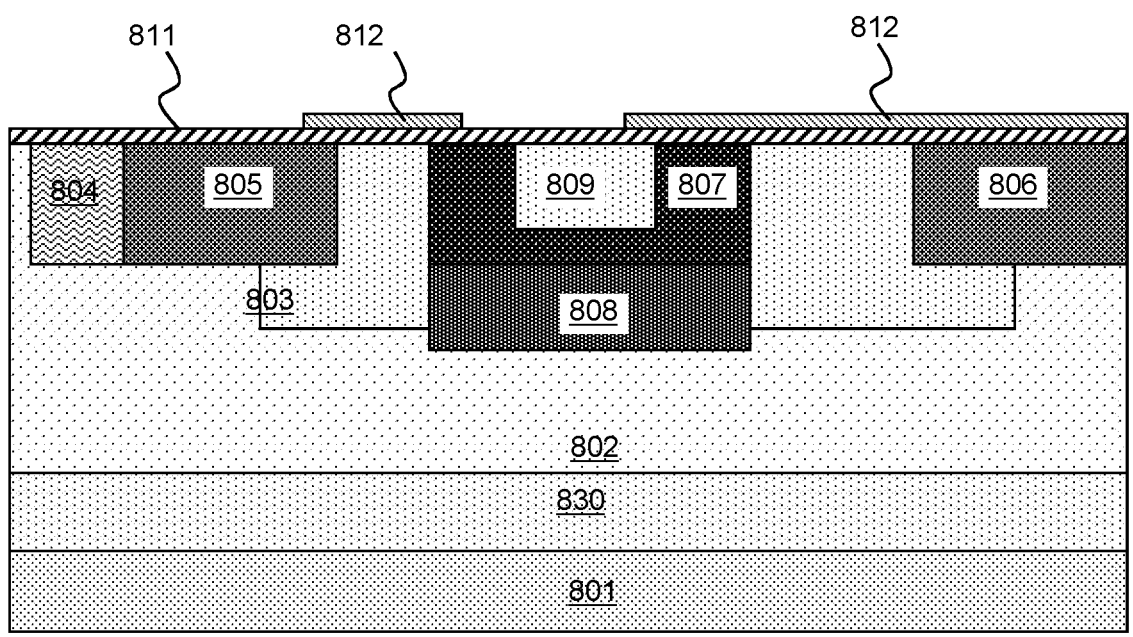
FIG. 8I shows a cross-sectional side view of a partially-formed semiconductor device having improved cell geometry with a gate layer on the surface of the insulating layer according to aspects of the present disclosure.
Figure 8J:
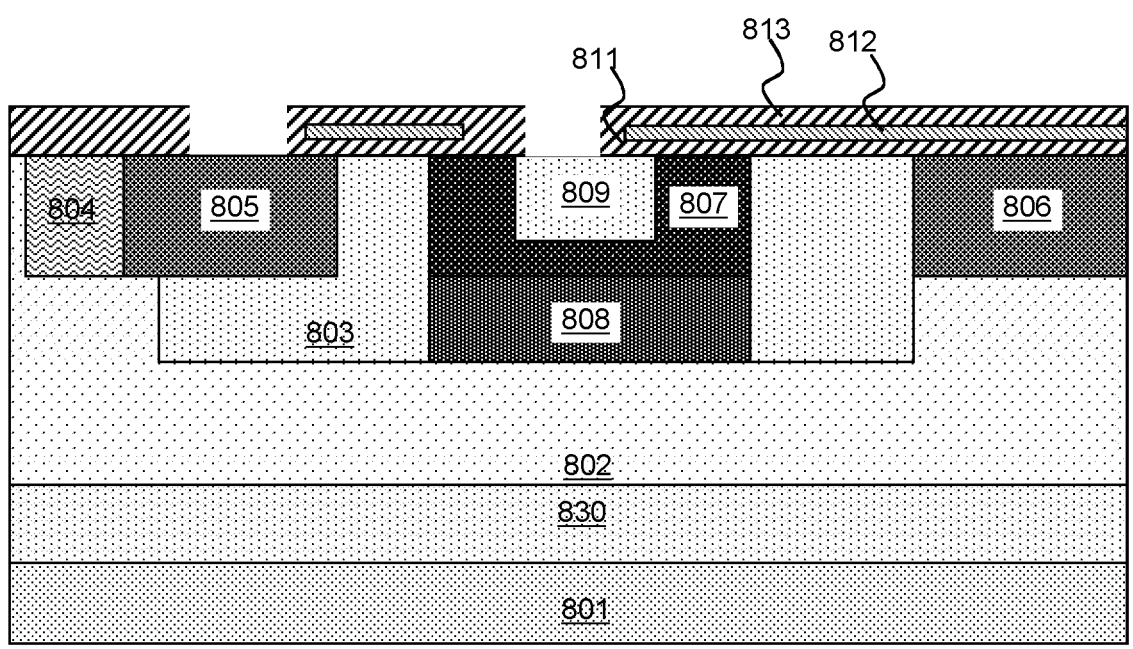
FIG. 8J depicts a cross-sectional side view of a partially-formed semiconductor device having improved cell geometry, with an additional insulating layer over top the gate layer and the insulating layer according to aspects of the present disclosure.
Figure 8K:
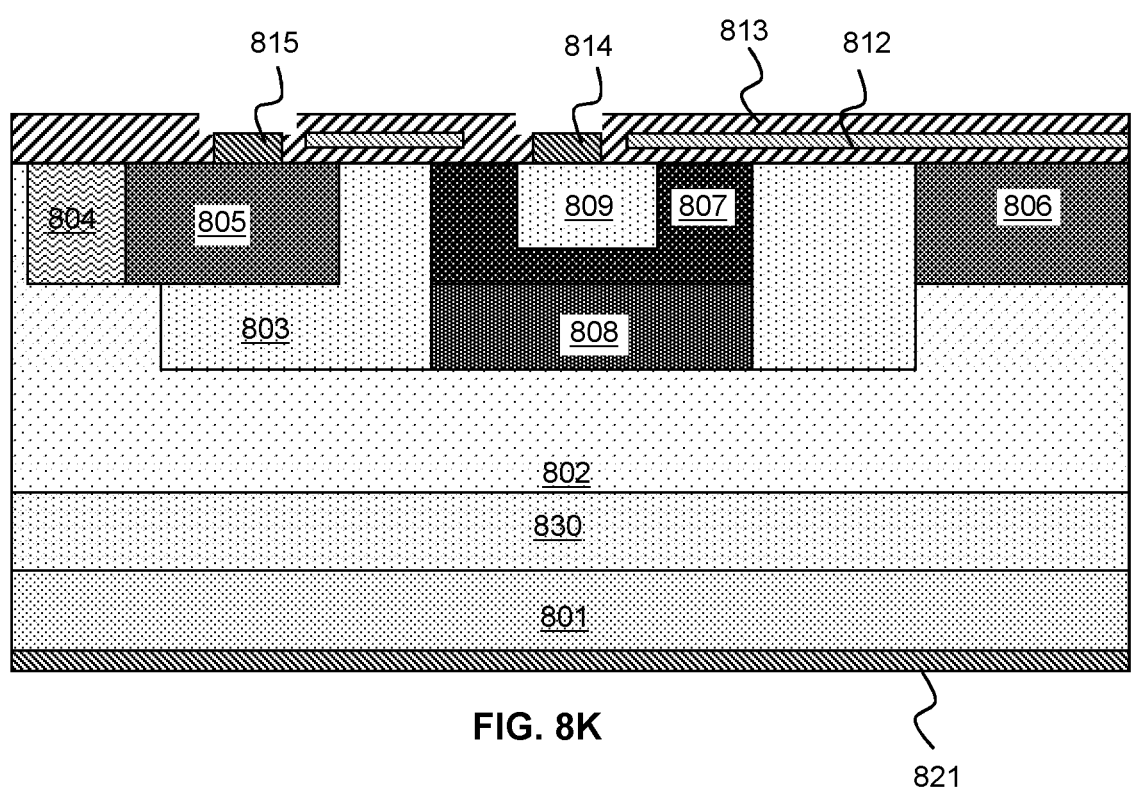
FIG. 8K shows a cross-sectional side view of a partially-formed semiconductor device having improved cell geometry, with a short contact and source contact formed through the insulating layer and drain contact on the bottom of the substrate according to aspects of the present disclosure.

FIG. 8H shows a cross-sectional side view of a partially-formed semiconductor device after formation of an insulation layer 811 on the surface of the semiconductor device over top the termination region 804, short region 805, JFET region 803, Body region 807, source region 809, and gate via region 806 according to aspects of the present disclosure. The insulating layer 810 may be an oxide such as silicon oxide grown on the surface of the semiconductor device through thermal oxidation or any other known method of oxide formation. Next as shown in FIG. 8I, the gate layer 812 is formed on the surface of the insulating layer 811. The gate layer may be comprised of polycrystalline silicon or another conductive material and may be formed by deposition methods such as chemical vapor deposition (CVD), physical vapor deposition (PVD), etc. Gate layer 812 formation may include additional steps such as gate layer doping, gate layer patterning and gate layer etching. An extra contact material such as Tungsten DiSilicide ($WSi_2$) may also be formed over the gate layer to increase the conductivity and the signal speed. These additional steps may be necessary to form a gate having the proper dimensions and conductivity for the semiconductor device. After creation of the gate layer 812, the gate is completed. FIG. 8J depicts a cross-sectional side view of fabrication of a semiconductor device having improved cell geometry after deposition of an additional insulating layer 813 over top the gate layer 812 and the insulating layer 811 according to aspects of the present disclosure. The additional insulating layer 813 may be comprised of silicon oxide and may alternatively be grown on the surface by thermal oxidation. After formation of the additional dielectric layer the insulating layer 811 and the additional insulating layer 813 undergo densification. FIG. 8K shows a cross-sectional side view of fabrication of a semiconductor device after formation of a short contact 815 and source contact 814 through the insulating layers 811, 813 and drain contact 821 on the bottom of the substrate 801 according to aspects of the present disclosure. In some implementations a wafer back grinding process may be performed to reduce wafer thickness and produce a reduced On-resistance. In such implementations, the drain contact 821 is formed as final step after back grinding followed by laser annealing. After densification, holes in the insulating layer 812 over the source region 809 and short region 805 using any suitable technique such as plasma dry etching through openings in a contact mask. The contact mask may be removed by plasma ashing and washing with a removal solution or by any other known mask removal technique for example and without limitation planarization or polishing. The short and source contacts may then be formed in the holes in the insulating layers 811, 813. By way of example, and not by way of limitation, a barrier layer of, Ti/TiN, may be formed to line the contact connection holes and remaining portions of the holes may then be filled in with contact metal to form electrically conductive plugs on top of the barrier layers. The source contact 814 and short contact 815 may be comprised of the same metal for example Nickel etc. The contact metal of the short contact 815 may be different from the contact metal of the source contact 814. For example, an N-type contact in a SiC device may be Nickel while a P-type contact may Nickel, Titanium, Aluminum, Cobalt or a combination thereof. On the bottom of the substrate 801 a drain contact 821 may be formed via deposition. The Semiconductor device may also be heated in an oven or in a chamber of Rapid Thermal Annealing (RTA) in different ambient, e.g., N or Ar to anneal the ohmic contacts.

Figure 8L:
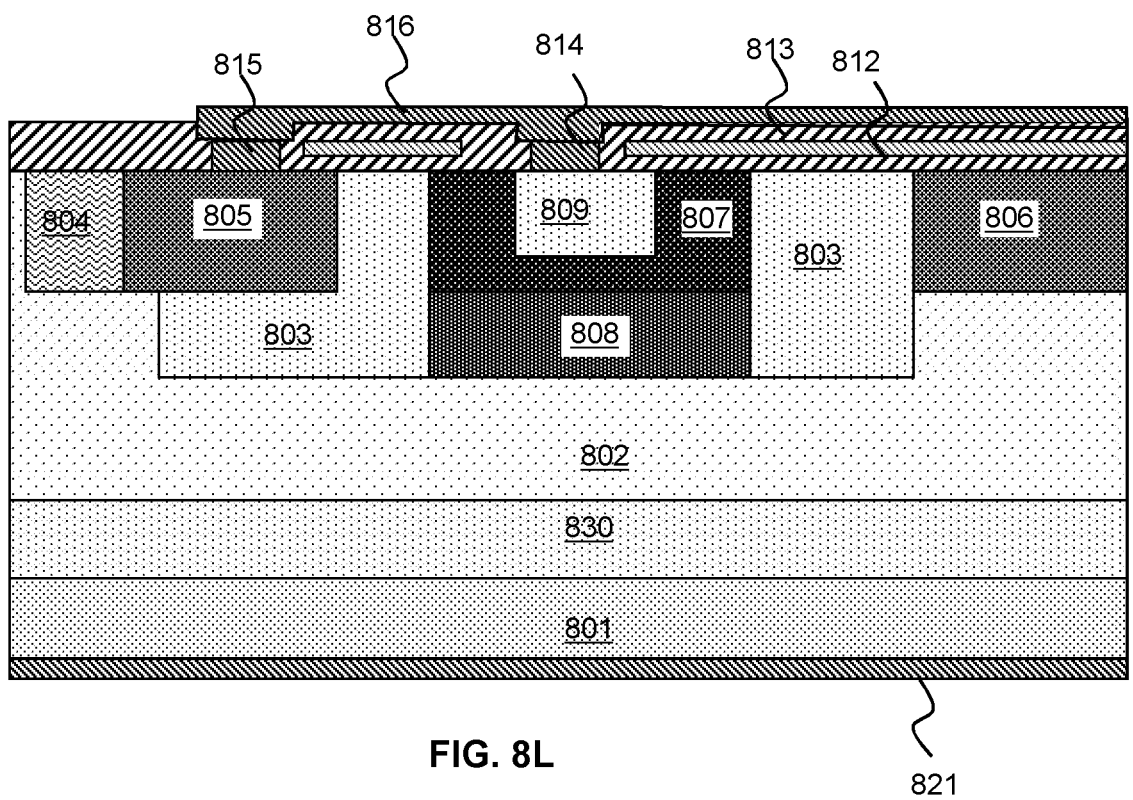
FIG. 8L depicts a cross-sectional side view of a partially-formed semiconductor device having improved cell geometry, power metal coupling the source contact and the short contact over the insulating layer according to aspects of the present disclosure.
Figure 8M:
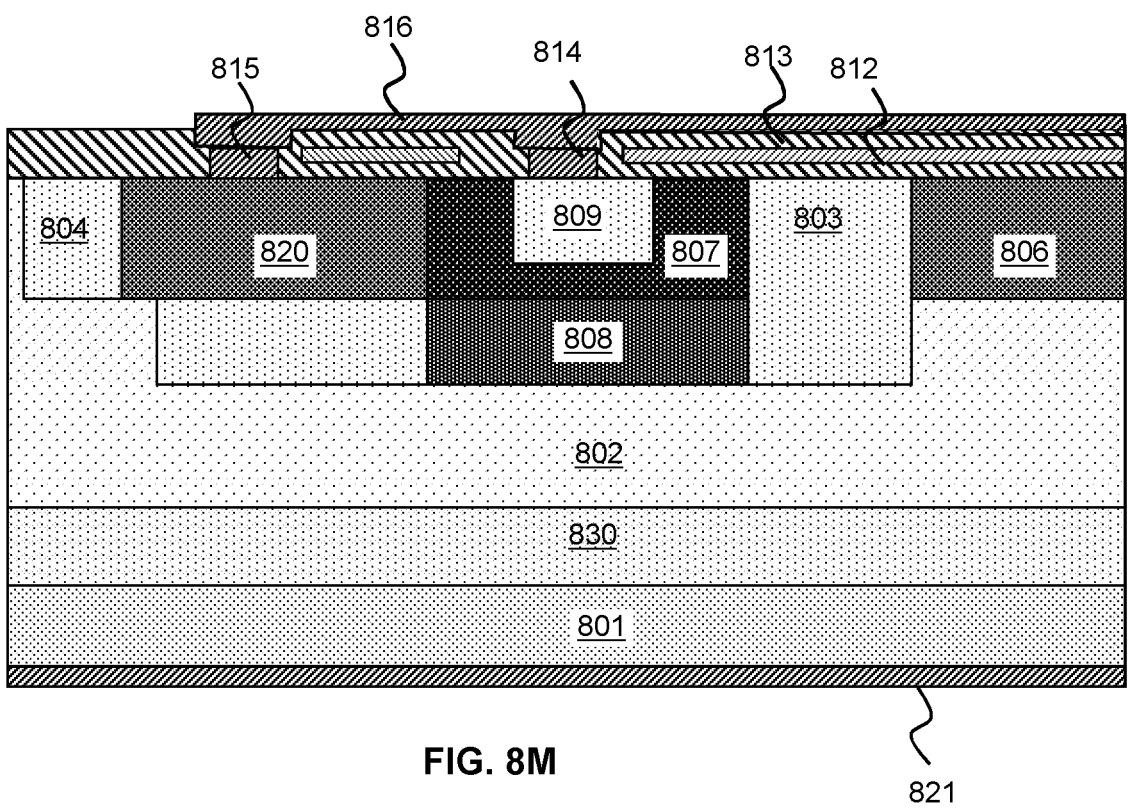
FIG. 8M shows a cross sectional side view of the semiconductor device having improved cell geometry, where the short region is coupled to the body region according to aspects of the present disclosure.
Figure 9:
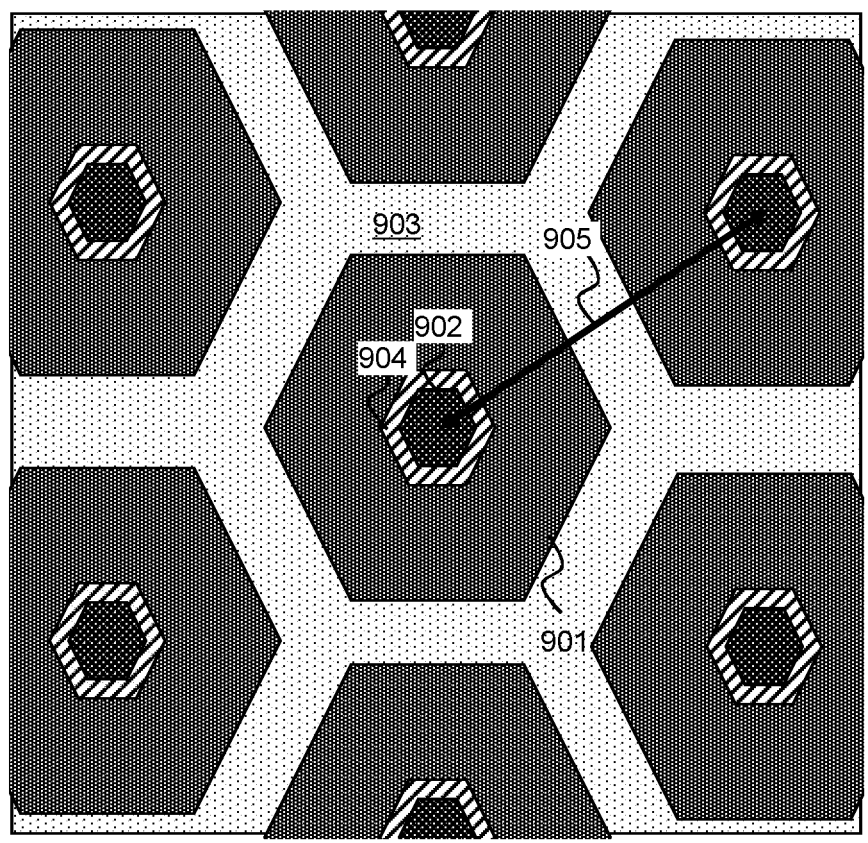
FIG. 9 depicts a top-down view of the epitaxial layer of a conventional semiconductor device cell geometry.

FIG. 8L depicts a cross-sectional side view of formation of the semiconductor device having improved cell geometry, power metal 816 coupling the source contact 814 and the short contact 815 over the insulating layer 813 according to aspects of the present disclosure. Metal may be disposed on the surface of the insulating layer 813 by deposition techniques such as physical vapor deposition (PVD), sputtering etc. Then the metal may be patterned and selectively etched to form a final power metal 816 on the top surface of the insulating layer 813. FIG. 8M shows a cross sectional side view of the semiconductor device where the short region 820 is coupled to the body region 807 according to aspects of the present disclosure. The portion of the short region 820 in contact with the body region 807 may be part of a strip of short region such as those shown in FIGS. 5-7 or may be part of the main short region touching the body region as shown in FIGS. 1-4. Finally, a polyimide layer (not shown) may be formed on the surface of the insulating layer 813 to protect the insulating layer and complete the semiconductor device.

A semiconductor device having improved cell geometry in accordance with aspects of the present disclosure allow for different metals to be used for the source contact and the short contact. This facilitates optimization of the contacts. In addition, While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A semiconductor device comprising:
   a substrate heavily doped with a first conductivity type
   an epitaxial layer lightly doped with the first conductivity type formed on the substrate;
   a buffer layer between the substrate and the epitaxial layer, wherein the buffer layer is doped with the first conductivity type at a doping level between that of the substrate and that of the epitaxial layer;
   a cell, the cell including:
      a body region doped with a second conductivity type formed in the epitaxial layer, wherein the second conductivity type is opposite the first conductivity type;
      a source region doped with the first conductivity type formed in at least the body region;
   the device further including:
      a short region doped with the second conductivity type formed in the epitaxial layer separated from source region of the cell by the body region of the cell;
      an insulating layer formed over the short region, the body region, and the source region;
      wherein the short region is conductively coupled to the source region by a short contact electrically connected to the short region through the insulation layer, a source contact electrically connected to the source region through the insulation layer, and a power metal layer electrically connected between the short contact and the source contact, wherein the power metal layer is formed over the insulation layer.

2. The semiconductor device of claim 1 wherein the body region of the cell is in ohmic contact with the short region.

3. The semiconductor device of claim 2 wherein a JFET region of the epitaxial layer separates a portion of the short region from the body region of the cell and a strip of the short region interrupts the JFET region wherein the strip of the short region makes ohmic contact with the body region of the cell.

4. The semiconductor device of claim 3 comprising more than one cell wherein the short region is shared between two or more cells.

5. The semiconductor device of claim 3 wherein the strip of the short region is a width sufficient for a current to travel to the body region from the short region.

6. The semiconductor device of claim 1 further comprising more than one cell wherein the short region is shared between two or more cells.

7. The semiconductor device of claim 6 wherein each cell of the more than one cells is separated by a JFET region wherein the width of the JFET region is chosen to have a sufficient low on-resistance and reduced electric field across the gate oxide.

8. The semiconductor device of claim 1 comprising a gate formed over the epitaxial layer and a portion of the body region.

9. The semiconductor device of claim 8 wherein the gate comprises an insulating layer formed on top of the epitaxial layer and a conductive layer formed on top of the insulating layer.

10. The semiconductor device of claim 1 wherein a material of the source contact is different than a material of the short contact.

11. The semiconductor device of claim 10 wherein the material of the source contact is a metal and wherein the material of the short contact is a metal and wherein the metal of source contact is different than the metal of the short contact.

12. A method of making a semiconductor device comprising:
    forming a cell by
        forming a body region in an epitaxial layer lightly doped with a first conductivity type formed on a substrate heavily doped with the first conductivity type with a buffer layer between the substrate and the epitaxial layer, wherein the buffer layer is doped with the first conductivity type at a doping level between that of the substrate and that of the epitaxial layer, wherein the body region is doped with a second conductivity type, wherein the second conductivity type is opposite the first conductivity type, and
        forming a source region doped with the first conductivity type in at least the body region;
    forming a short region in the epitaxial layer, wherein the short region is doped with the second conductivity type, wherein the short region is separated from source region of the cell by the body region of the cell;
    forming an insulating layer over the short region, the body region, and the source region; and
    forming a short contact electrically connected to the short region through the insulation layer, a source contact electrically connected to the source region through the insulation layer, and a power metal layer electrically connected between the short contact and the source contact, wherein the power metal layer is formed over the insulation layer, whereby the short region is conductively coupled to the source region.

13. The method of claim 12 wherein the body region of the cell is in ohmic contact with the short region.

14. The method of claim 13 wherein a JFET region of the epitaxial layer separates a portion of the short region from the body region of the cell, the method further comprising forming a strip of the short region that interrupts the JFET region wherein the strip of the short region makes ohmic contact with the body region of the cell.

15. The method of claim 14 further comprising forming more than one cell wherein the short region is shared between the more than one cell.

16. The method of claim 14 wherein the strip of the short region is a width sufficient for a current to travel to the body region from the short region.

17. The method of claim 12 further comprising forming more than one cell wherein the short region is shared between the more than one cell.

18. The method of claim 17 wherein each cell of the more than one cells is separated by a JFET region wherein the width of the JFET region is chosen to have a sufficient low on-resistance and reduced electric field across the gate oxide.

19. The method of claim 12 comprising forming a gate over the epitaxial layer and a portion of the body region.

20. The method of claim 19 wherein forming the gate comprises creating an insulating layer on top of the epitaxial layer and a forming a conductive layer formed on top of the insulating layer.

21. The method of claim 19 wherein a material of the source contact is different than a material of the short contact.

22. The method of claim 21 wherein the material of the source contact is a metal and wherein the material of the short contact is a metal and wherein the metal of source contact might be different than the metal of the short contact.

* * * * *